United States Patent
Barrett

(10) Patent No.: US 6,198,646 B1
(45) Date of Patent: Mar. 6, 2001

(54) COMMUTATION CIRCUIT FOR ARRESTING AND DISSIPATING ENERGY REFLECTED FROM A MAGNETIC PULSE COMPRESSION NETWORK

(75) Inventor: David M. Barrett, Albuquerque, NM (US)

(73) Assignee: Quantum Manufacturing Technologies, Inc., Albuquerque, NM (US)

( * ) Notice: Subject to any disclaimer, the term of this patent is extended or adjusted under 35 U.S.C. 154(b) by 0 days.

(21) Appl. No.: 09/464,444

(22) Filed: Dec. 16, 1999

Related U.S. Application Data
(60) Provisional application No. 60/115,350, filed on Jan. 8, 1999.

(51) Int. Cl.[7] .................................................. H02M 3/24
(52) U.S. Cl. .................................. 363/96; 372/38; 372/82
(58) Field of Search ........................... 372/37, 38, 81, 372/82; 363/20, 40, 47, 50, 96, 97, 95

(56) References Cited

U.S. PATENT DOCUMENTS

| | | | |
|---|---|---|---|
| 4,151,528 | * | 4/1979 | Johannessen ........................ 343/103 |
| 4,946,793 | * | 8/1990 | Marshall, III ....................... 435/291 |
| 5,072,191 | * | 12/1991 | Nakajima et al. .................... 328/65 |
| 5,729,562 | * | 3/1998 | Birx et al. ............................ 372/38 |
| 6,020,723 | * | 2/2000 | Desor et al. ........................ 320/166 |

OTHER PUBLICATIONS

Newton, M.A., et al., Design and Testing of the 5 KHz 3 MW Thyratron Modulators for ETA II, 18th Power Modulator Symposium, 1988.

Newton, M.A., et al., Timing and Voltage Control of Magnetic Modulators of ETA II, 7th IEEE International Pulsed Power Conf., 1989.

S. Ashby, CLIA—A Compact Linear Induction Accelerator System, 8th IEEE International Pulsed Power Conf., 1991.

* cited by examiner

Primary Examiner—Peter S. Wong
Assistant Examiner—Gary L. Laxton
(74) Attorney, Agent, or Firm—McDermott, Will & Emery

(57) ABSTRACT

An improved commutation circuit configured to arrest and dissipate energy which may be reflected from a magnetic pulse compression network. The commutation circuit includes an energy storage capacitor for storing energy, a capacitor charging unit for charging the energy storage capacitor, a power supply protection circuit configured for isolating reverse voltages from the output of the capacitor charging unit, a series switch configured for conducting current in the forward direction and blocking current in the reverse direction to and from the energy storage capacitor, a magnetic assist device configured for isolating the reverse voltage from the switch, a trigger circuit configured for transmitting a trigger pulse signal to the switch to allow the transfer of reflected energy to the energy storage capacitor and a power supply configured for biasing the magnetic assist device. The improved commutation circuit also includes a tail-biter circuit in parallel with the energy storage capacitor for capturing and dissipating the reflected energy from the capacitor, thereby protecting the commutation circuit from reflected energy from a magnetic pulse compression network which can damage the components of the commutation circuit.

20 Claims, 5 Drawing Sheets

COMMUTATION CIRCUIT FOR ARRESTING AND DISSIPATING ENERGY REFLECTED FROM A MAGNETIC PULSE COMPRESSION NETWORK

This application claims benefit of provisional application No. 60/115,350, filed Jan. 8, 1999.

FIELD OF INVENTION

The present invention generally relates to commutation circuits used to drive magnetic pulse compression networks in magnetic modulator systems and more particularly relates to a commutation circuit that arrests and dissipates energy reflected from a magnetic pulse compression network.

BACKGROUND OF THE INVENTION

Magnetic modulator systems are typically used to generate high peak power electrical pulses for a variety of applications. In its simplest form, a magnetic modulator system consists of two principal sections as illustrated in FIG. 1: the commutation circuit 2 and the magnetic pulse compression network 4. The commutation circuit 2, sometimes referred to as the intermediate energy storage (IES) circuit, transfers energy to the input of the magnetic pulse compression network 4. The magnetic pulse compression network 4 compresses the energy. As illustrated, the magnetic pulse compression network 4 consists of a number of shunt capacitor elements each separated by a saturable inductor, generally known to those in the art as a magnetic switch. Specifically, the commutation circuit 2 and the pulse compression network 4 operate in concert as follows.

A power supply unit 6 in the commutation circuit 2 charges an energy storage capacitor $C_0$ 8 to a specified voltage $V_0$. Once charged, $C_0$ 8 is discharged through switch $S_1$ 10 and inductor $L_0$ 22, into the input of the magnetic pulse compression network 4. This is indicated by the current waveform $i_o(t)$ shown in FIG. 2.

The discharge of $C_0$ 8 into the magnetic pulse compression network 4 causes the energy, originally stored in $C_0$ 8 to be resonantly transferred to capacitor $C_1$ 12 over a period $t_0$. As a result, $C_1$ 12 charges to a voltage determined by the turns ratio of transformer $T_1$ 14.

While $C_1$ 12 is being charged, magnetic switch ($MS_1$) 16 is initially biased such that it presents a high impedance to the voltage across the switch. As a result, while $C_1$ 12 is being charged, little current flows through $MS_1$ 16. $MS_1$ 16 is designed such that when $C_1$ 12 is fully charged, $MS_1$ 16 saturates meaning that the impedance of $MS_1$ 16 significantly decreases allowing the discharge of $C_1$ 12 into $C_2$. Temporal compression of the energy pulse is achieved by designing the network such that each capacitor is discharged significantly faster than it was charged. By cascading a number of magnetic pulse compression stages, an energy pulse can be compressed temporally to very short pulse widths, thereby achieving large peak powers at the output of the magnetic pulse compression network 4.

The temporal compression which is achieved as the energy pulse propagates through the magnetic pulse compression network 4 is illustrated in FIG. 2. Capacitor $C_1$ 12 is discharged through $MS_1$ 16 over the period $t_1$ as indicated. The subsequent discharge of $C_2$ through $MS_2$ occurs over a period $t_2$, where $t_2$ is shorter than $t_1$. This process continues until the last capacitor $C_n$ is discharged through $MS_n$ into the load 20 over a period $t_n$.

Under ideal conditions, the impedance of the load 20 is matched to that of the output stage of the magnetic pulse compression network 4. Under such circumstances, all of the energy will be coupled to the load 20 and dissipated. Therefore, no energy will be reflected from the load 20 back into the output of the magnetic pulse compression network 4. However, in a number of applications, it is impractical, if not impossible, to ensure that the load impedance is always matched to that of the output stage of the compression network 4. As a result, a fraction of the energy arriving at the output of the magnetic pulse compression network 4 may be reflected towards the front end of the network. In general, the greater the impedance mismatch between the output of the network and the load 20, the greater the magnitude of the reflected energy.

Uncontrolled energy reflections in the form of reversed voltages can be a serious problem for the modulator system. This is because the circuit dynamics of the magnetic pulse compression network 4 are such that negative voltage reflections will be quickly propagated towards the front end of the network, relatively unimpeded by the network itself. As a result, it is possible to obtain very large reflections at the input of the magnetic pulse compression network 4 in the form of reversed voltages. If not properly handled, the reflected energy may be transferred back to the commutation circuit 2 in the form of voltage reversals on $C_0$ 8. This may cause significant damage to portions of the commutation circuit 2. In particular, if the power supply unit 6 is of the switch-mode capacitor charging type, a high level of voltage reversal on $C_o$ 8 can cause damage to the power supply unit 6. In addition, the reflected energy may continue to be transferred back and forth between the commutation circuit 2 and the magnetic pulse compression network 4, possibly causing damage to the modulator system or interfering with its desired operation on subsequent pulses.

SUMMARY OF INVENTION

It is an object of the present invention to provide a commutation circuit which has the capability of arresting energy reflected from a magnetic pulse compression network.

It is another object of the present invention to provide a commutation circuit which subsequently dissipates the reflected energy which has been arrested.

It is another object of the present invention to provide a commutation circuit which ascertains the impedance mismatch between the output of the magnetic modulator system and the load which the system is driving.

It is another object of the present invention to provide a commutation circuit which detects faults in the magnetic pulse compression network.

In accordance with these and other objectives, the commutation circuit of the present invention comprises a power supply unit, an energy storage capacitor, a switch element, a saturable inductor serving as a magnetic assist device, and a tail-biter circuit which operates in concert to provide the appropriate input pulse to a magnetic pulse compression network while arresting and dissipating energy reflected from the compression network to the commutation circuit.

The switch element preferably comprises a switch which conducts current through the commutation circuit for a sufficient period such that any energy reflected from the magnetic pulse compression network will be conducted through the switch and arrested in the energy storage capacitor. Once the reflected energy is arrested in the energy storage capacitor, the switch prevents current from flowing in the reverse direction through the commutation circuit, thereby preventing the reflected energy from being transferred back to the input of the magnetic pulse compression network.

The saturable inductor preferably comprises a magnetic core surrounded by an appropriate number of turns of conducting winding such that a magnetic assist device is formed. This magnetic assist device, placed in series with the switch isolates reverse voltage from the switch for a brief period, thereby assisting in the reverse recovery of the switch.

The tail-biter circuit preferably comprises a series resistor-diode combination placed in parallel with the energy storage capacitor to effect the quick discharge of the energy storage capacitor to which the energy has been reflected in the form of a voltage reversal.

The commutation circuit is preferably arranged such that the energy storage capacitor is charged to a predetermined voltage and subsequently discharged through the switch element into the input of a magnetic pulse compression network. Assuming that the impedance of the output stage of the compression network is mismatched to that of the load which it is driving, a voltage reflection in the form of a negative voltage level presents itself at the input stage of the magnetic pulse compression network.

The switch is preferably configured for conducting reflected energy from the input stage of the magnetic pulse compression network to the energy storage capacitor in the commutation circuit. As such, a reversed voltage appears across the commutation circuit capacitor. The switch is also preferably configured as an unidirectional switch, capable of current conduction in the forward direction only. When all of the reflected energy has been transferred to the capacitor in the commutation circuit in the form of a reversed voltage, the switch is intended to block reverse current, thus preventing the reflected energy from being transferred back to the input stage of the pulse compression network.

The magnetic assist device is preferably placed in series with the switch such that instantaneous reverse voltage is prevented from being developed across the switch. As a result, the switch recovers in the reverse direction and the reflected energy is retained in the energy storage capacitor. In this manner, the energy reflected from the pulse compression network is arrested in the commutation circuit.

Subsequent to the arrest of the reflected energy in the energy storage capacitor, the reflected energy is dissipated from the capacitor by the tail-biter circuit which is situated in parallel with the capacitor. The tail-biter circuit permits current to flow through its resistance when the circuit is forward-biased by a reversed voltage on the energy storage capacitor. The tail-biter resistance is appropriately sized to yield the desired discharge time of the reflected energy. In this manner, the energy which has been reflected to and arrested in the energy storage capacitor is dissipated.

Additional objects, advantages and novel features of the present invention will be set forth in part in the description which follows and in part becomes apparent to those skilled in the art upon examination of the following or may be learned by the practice of the invention.

DESCRIPTION OF THE PREFERRED EMBODIMENTS

Figure 1:
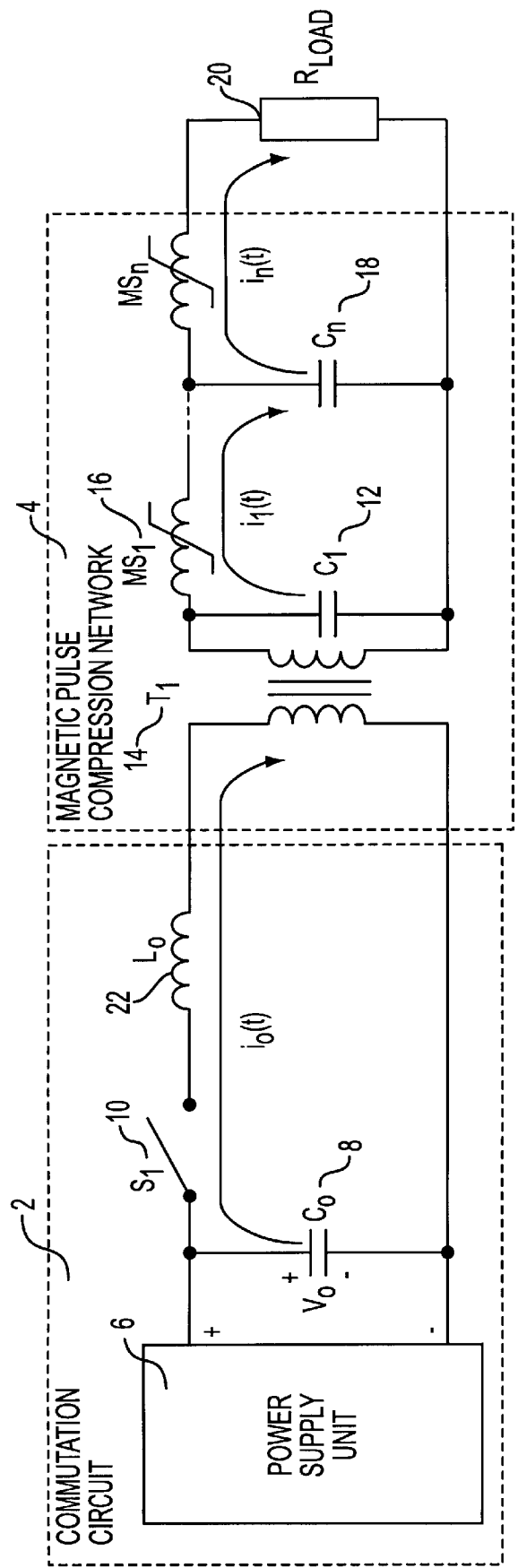
FIG. 1 illustrates a magnetic modulator system comprising a commutation circuit and a magnetic pulse compression network (Prior Art).
Figure 2:
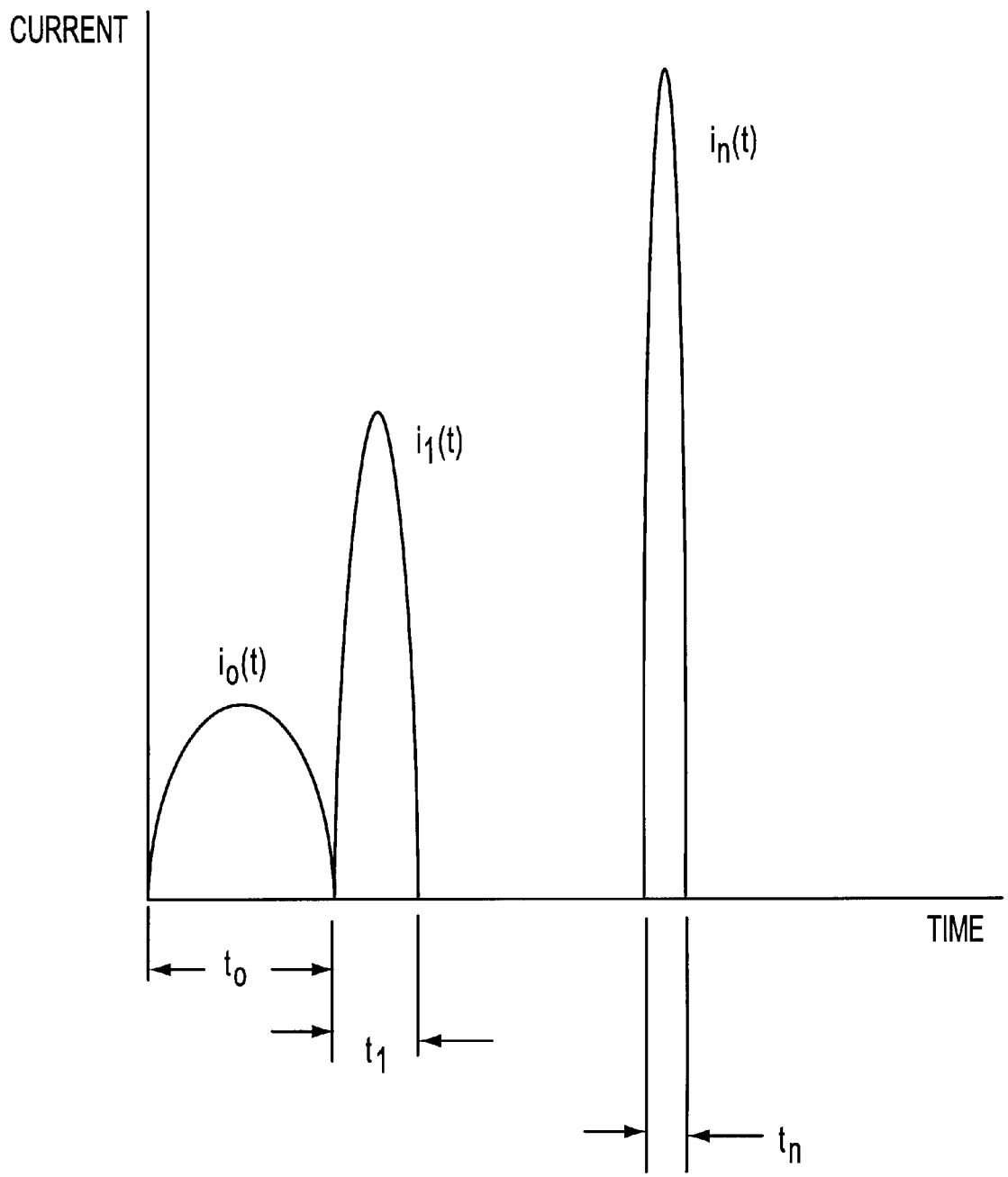
FIG. 2 illustrates the typical current waveforms in a magnetic modulator system (Prior Art).
Figure 3:
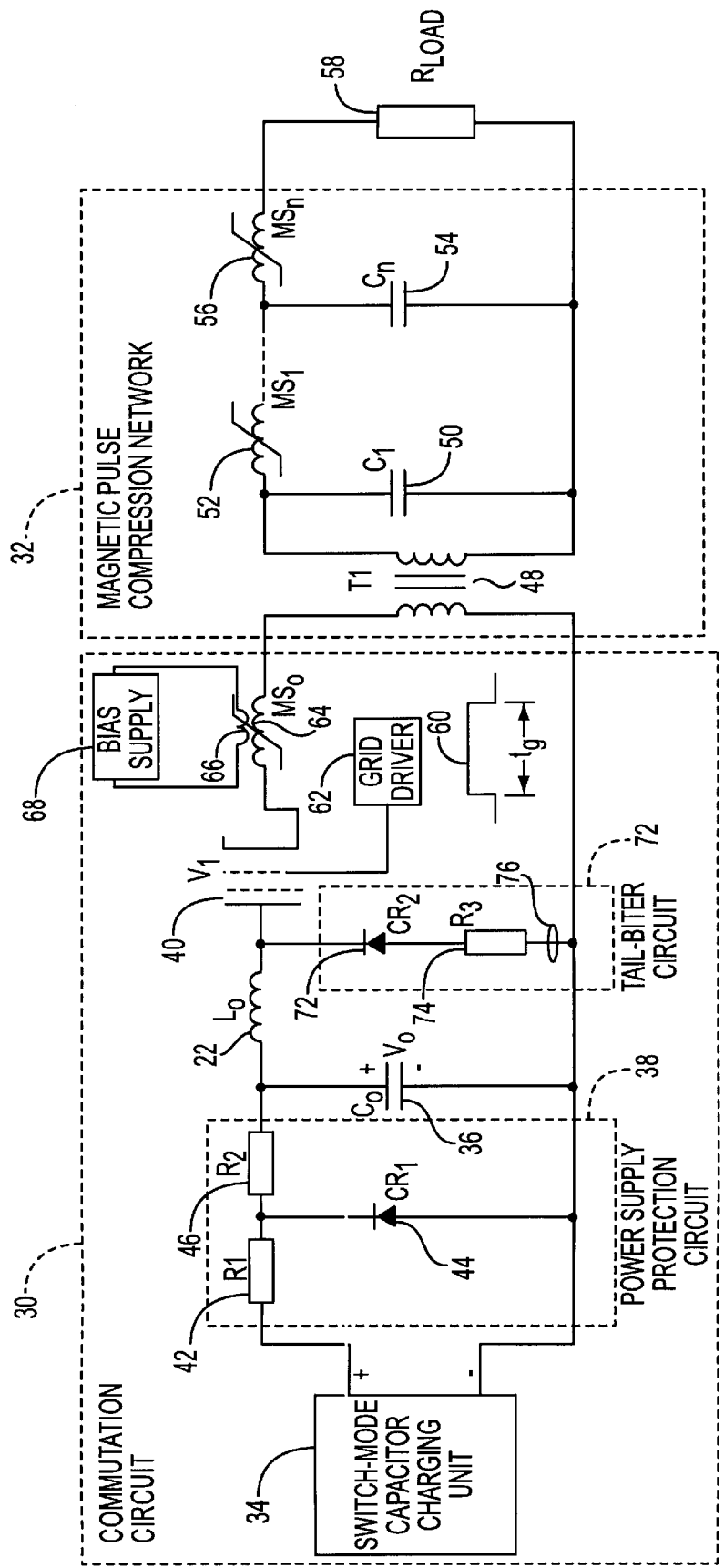
FIG. 3 illustrates a simplified electrical schematic of the improved commutation circuit.
Figure 4A:
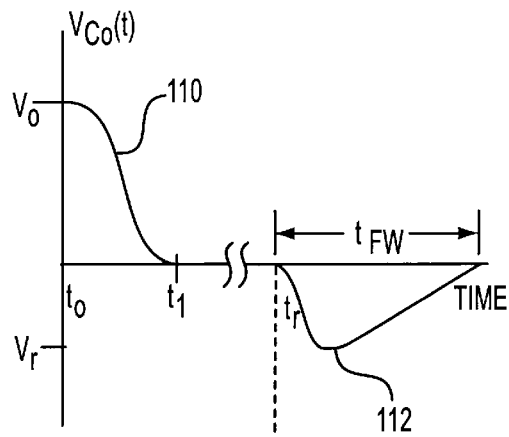
FIG. 4(a) illustrates the voltage waveform across capacitor $C_o$ in the improved commutation circuit.
Figure 4B:
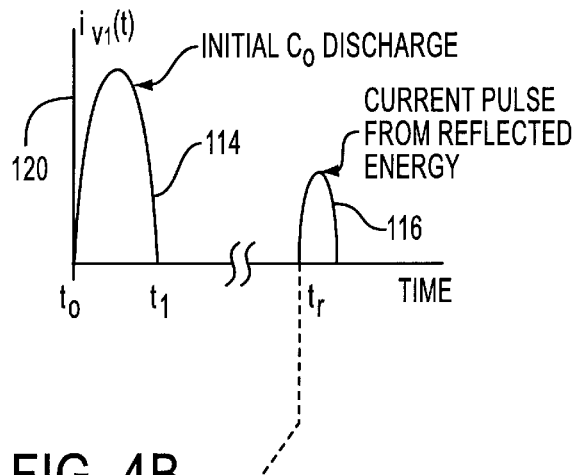
FIG. 4(b) illustrates the current flow through the improved commutation circuit.
Figure 4C:
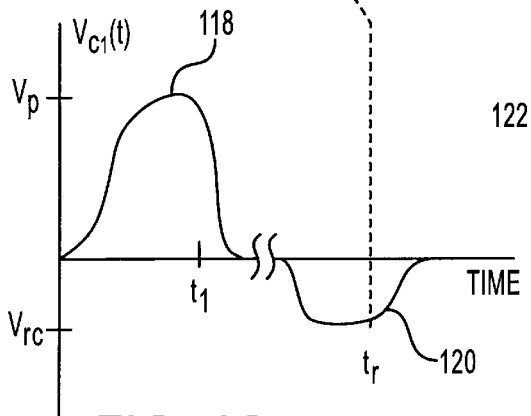
FIG. 4(c) illustrates the voltage waveform across the input capacitor $C_1$ in the magnetic compression network when driven by the improved commutation circuit.
Figure 4D:
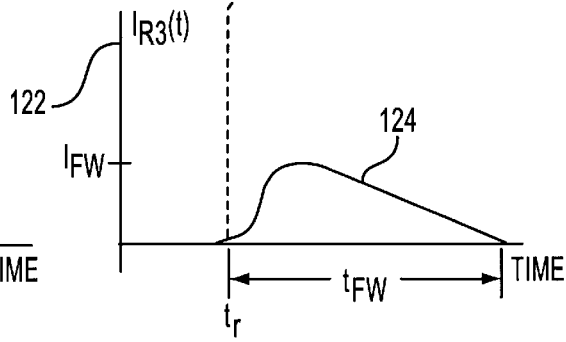
FIG. 4(d) illustrates the current waveform which is conducted through the tail-biter circuit in the improved commutation circuit.
Figure 5:
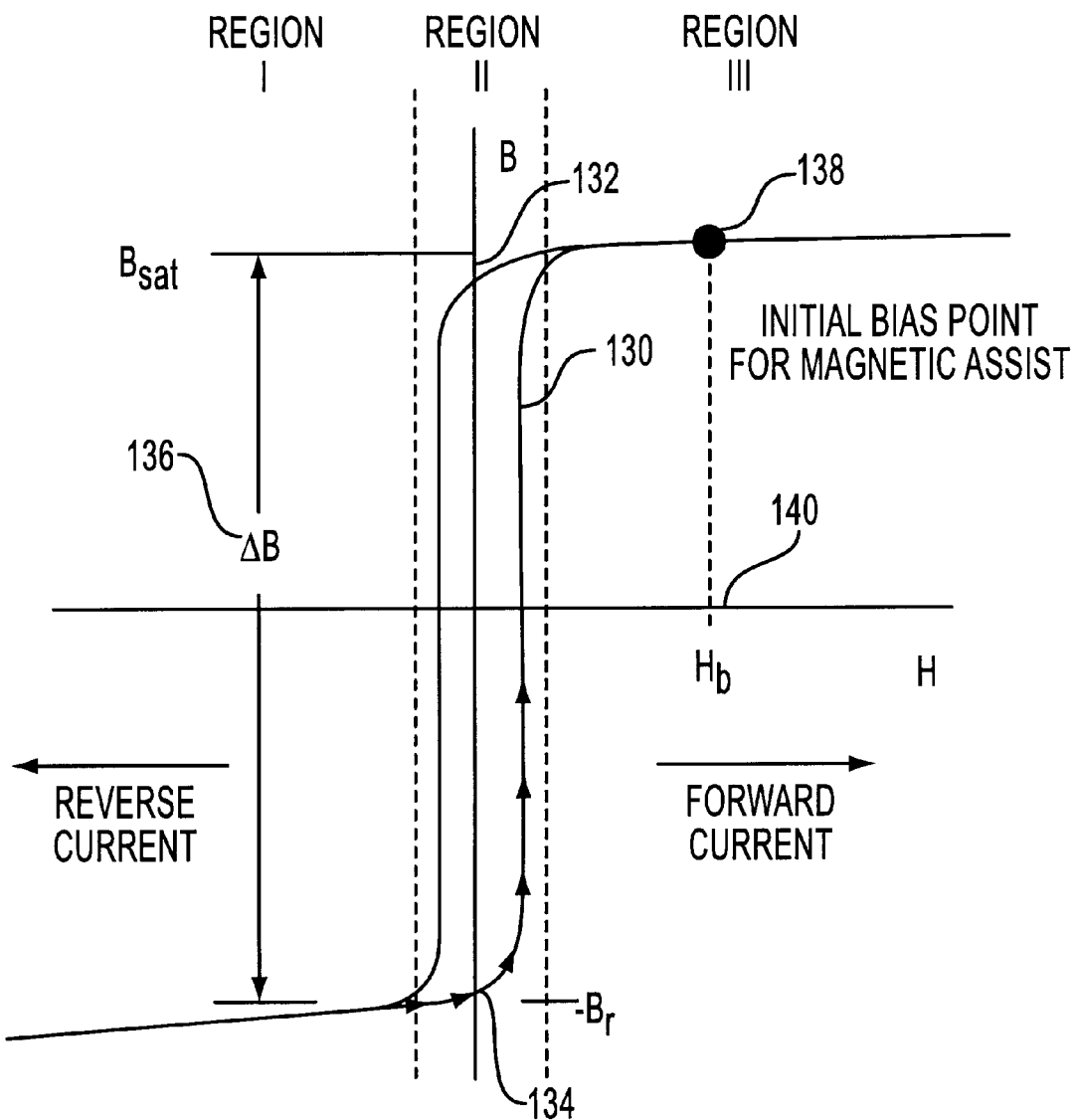
FIG. 5 illustrates a typical B-H curve of a ferri- or ferromagnetic material and indicates the bias point for the magnetic assist device.

Reference will now be made to FIGS. 3–5 which depict an illustrative, non-limiting, embodiment of the invention.

FIG. 3 is a simplified electrical schematic of the improved commutation circuit 30 of the present invention. A switch-mode power supply capacitor charging unit 34 charges the energy storage capacitor $C_o$ 36 to a specified voltage, typically 30 kV. Interposed between the output of the charging unit 34 and switch 40 is a power supply protection circuit 38 comprising an input resistance 42, a shunt inverse diode 44 and an output resistance 46. The protection circuit 38 serves to isolate reverse voltage which may appear on $C_o$ 36 from the output of the charging unit 34.

Once $C_0$ 36 is charged to the desired voltage, the switch 40 is triggered, causing $C_0$ 36 to be discharged into the input of the magnetic pulse compression network 32 through inductor $L_0$ 22. In the preferred embodiment, the switch 40 is a thyratron, however, the switch 40 can be a comparable switching device such as a silicon controlled rectifier (SCR) stack assembly or a similar assembly which is capable of unidirectional current conduction.

As $C_0$ 36 is being discharged, the voltage 110 across $C_0$ 36 decreases as indicated in FIG. 4(a). $C_0$ 36 discharges into the primary of a step-up transformer $T_1$ 48 which enables the capacitor $C_1$ 50 in the first stage of the pulse compression network to be charged consistent with the turns ration of the step-up transformer $T_1$ 48. As $C_0$ 36 is discharged, energy is transferred to $C_1$ 50 as indicated by the voltage waveform 118 in FIG. 4(c). The current waveform 114 associated with the discharge of $C_0$ 36 into the magnetic pulse compression network 32 is illustrated in FIG. 4(b). As all of the energy is transferred to $C_1$ 50, the voltage waveform 118 nears its peak. At peak voltage, magnetic switch $MS_1$ 52 saturates permitting $C_1$ 50 to discharge into the next stage of the magnetic pulse compression network 32. The discharge of $C_1$ 50 is indicated by the decreasing voltage waveform 118 across $C_1$ 50 beginning at time $t_1$. This process continues until the final capacitor $C_n$ 54 is charged and subsequently discharged through $MS_n$ 56 into the load 58 dissipating most of the energy into the load 58. Under some situations, the impedance match between the output stage of the magnetic pulse compression network 32 and the load 58 may be such that a significant portion of the energy pulse is reflected back into the output of the magnetic pulse compression network 32 in the form of a voltage reversal. In such a situation, the dynamics of the magnetic pulse compression network 32 are such that the reflected energy will be propagated towards the front end of the magnetic pulse compression network 32, eventually appearing as a voltage reversal 120 on $C_1$ 50 as indicated in FIG. 4(c).

The switch 40, i.e., a thyratron, is maintained in conduction for a sufficient period such that the reversed voltage appearing on $C_1$ 50 is subsequently transferred to $C_0$ 36 in the commutation circuit 30. This is accomplished by maintaining the trigger pulse 60, generated by the thyratron grid driver 62, active for a period which is sufficient to effect the transfer of the reflected energy to the commutation circuit 30. Assuming that the conduction period of the thyratron is sufficient, a negative voltage on $C_1$ 50 will cause the second current pulse 116 to occur in the commutation circuit 30. Therefore, the reflected energy is transferred from $C_1$ 50 in the form of a negative voltage to $C_0$ 36 in the commutation circuit 30. As a result, the reflected energy is transferred to $C_0$ 36 in the form of a reversed voltage 112. One of the salient characteristics of the thyratron or any other switch 40 used in this circuit is the ability to conduct current in the forward direction through the commutation circuit 30. It is noted that both the main current pulse 114 resulting from the initial discharge of $C_0$ 36 into the magnetic pulse compression network 32 and the subsequent current pulse 116 associated with the reflected energy pulse are both conducted in the forward direction through the commutation circuit 30. If the switching device 40 prevents reverse current flow through the commutation circuit 30, once capacitor $C_0$ 36 is charged with a reversed voltage 112 as indicated in FIG. 4(a) then the energy cannot be transferred from $C_0$ 36 to the input of the magnetic pulse compression network 32 once again.

Central to the desired operation of the commutation circuit 30 is that the switch 40, i.e., thyratron $V_1$, must be able to conduct current in the forward direction through the commutation circuit 30 for a sufficient period so as to permit the reflected energy to be transferred from $C_1$ 50 in the magnetic pulse compression network 32 back to $C_0$ 36 in the commutation circuit 30 where it is to be arrested. This is accomplished by ensuring that the trigger pulse 60 placed upon the control grid of the thyratron remains active for a period sufficient to transfer the reflected energy from the input of the magnetic pulse compression network 32 back to $C_0$ 36.

Also central to the desired operation of the commutation circuit 30 is that the switch 40, i.e., thyratron $V_1$, be capable of blocking current flow in the reverse direction through the commutation circuit 30. As a result, when a reversed voltage is developed across the switch 40, current is prevented from flowing through the switch 40 in the reverse direction. Since, the reverse current cannot flow through the switch 40, the reflected energy to $C_0$ 36 during the forward conduction of the switch, is retained in $C_0$ 36 thereby preventing the energy from being transferred back to $C_1$ 50 by the inability of the switch 40 to conduct in the reverse direction.

Under ideal circumstances, a thyratron will indeed serve as an unidirectional switch as required for the desired operation of the commutation circuit 30. A thyratron tends to conduct current in the forward direction when a forward voltage is seen across the device. This assumes that forward current conduction has been initiated with the appropriate trigger pulse 60 on the control grid of the thyratron. In addition, in an ideal case, a thyratron tends to block reverse current when a reverse voltage is seen across the device. As such, the thyratron tends to operate as an ideal diode.

Due to limitations which may be associated with the switch 40, especially thyratrons, the ability for the switch 40 to function as an ideal diode may be compromised. Specifically, if a reversed voltage is applied across the thyratron device too quickly, the thyratron may fail to block in the reverse direction. When a reversed voltage is applied across the device at an excessive rate, there is an increase probability that arcing internal to the thyratron will occur. Such arcing would compromise the ability of the thyratron to block reverse current as required for the desired operation of the commutation circuit 30. In addition, such arcing can cause damage to the thyratron significantly reducing its reliability and lifetime. This situation can be avoided if a brief delay is introduced between the end of the forward current conduction and the application of reverse voltage across the thyratron. Such a delay may be introduced by placing a magnetic assist device ($MS_a$) 64 in series with the thyratron. The magnetic assist device 64 may be in the form of a saturable inductor which is used in this circuit to momentarily isolate reverse voltage from the thyratron while it is recovering the capability of sustaining a reverse voltage. The magnetic assist device 64, like all saturable inductors consists of a winding, wound upon a ferri- or ferromagnetic core. The B-H curve of a typical ferri- or ferromagnetic core is shown is shown in FIG. 5.

The B-H curve of a typical magnetic core is characterized by three distinct regions as indicated. Regions I and III are referred to as the reversed saturation and forward saturation regions respectively. In both of these regions, the slope of B (the magnetic flux intensity) with respect to H (the magnetic field intensity) is relatively small. As a result, the permeability of the core in these regions approaches that of free space. Consequently, the core is seen to be saturated in regions I and III. In these regions, the inductance associated with the winding wound about the magnetic core is of a relatively low value. As such, the inductance of the magnetic assist device 64 when its core is operating in these regions is such that it can conduct high currents with small voltage drops.

Region II, interposed between the two regions of saturation, is characterized by a large slope of B with respect to H indicating that the permeability of the core when operating in region II is relatively high compared to that when the core is operating in either of the two saturation regions. As a result, the inductance associated with the magnetic assist device 64 is relatively large when the core is operated in region II. Consequently, the magnetic assist device 64 supports a large voltage while maintaining a small current flow.

Although magnetic assist devices have been widely used to provide a time delay between the trigger of a switch 40 and the conduction of current, the magnetic assist device 64 in the commutation circuit 30 provides a delay between the end of the forward conduction through the switch 40 and the application of reverse voltage across the switch 40. This is preferably accomplished by biasing the magnetic core. When biased at point 138, forward current conducted through the switch 40 pushes the operating point of the magnetic core further to the right of the B-H curve and remains in region III. As a result, the magnetic assist device 64 offers little impedance to forward current being conducted through the commutation circuit.

As energy is reflected to $C_0$ 36 and the current tries to reverse through the switch 40 and the magnetic assist device 64, the operating point of the magnetic core must move to the left on the B-H curve. As a result, the operating point must pass through region II of the B-H curve; the region of high permeability of the core and high inductance for the magnetic assist. Consequently, most of the reverse voltage is applied across the magnetic assist device 64 for a period which is consistent with the time required to swing the core from forward saturation 132 to the reverse saturation regime 134. The time required for such a flux swing in the core is given by Faraday's law and can be expressed by $$t_{sat} = (N A_m \Delta B)/<V> \quad (1)$$

where
$t_{sat}$=time for which the reverse voltage is supported across the magnetic assist and isolated from the switch
$\Delta B$ flux swing of the magnetic core
$A_m$=cross-sectional area of the magnetic core
N=number of turns of the winding surrounding the core
<V>=average reverse voltage applied across the magnetic assist device.

Using the above equation (1), the magnetic assist device 64 may be designed to provide he appropriate isolation so that the thyratron can obtain the ability to sustain reverse voltage. Typically, an isolation delay on the order of a microsecond is required to ensure that arcing will not occur internal to the thyratron.

The core of the magnetic assist device 64 is biased at the desired biased point 138 by maintaining a magnetic field intensity $H_b$ 140 in the same direction as the H-field produced by current flowing in the forward direction through the commutation circuit. In the illustrated example, the bias field is provided by an auxiliary winding 66 wound about the core of the magnetic assist device 64. Current flowing through the bias winding 66 is preferably provided by an auxiliary direct current power supply (bias supply) 68.

Having satisfied these two primary requirements; 1) the switch 40 conducts current for a sufficient period such that the reflected energy can be fully transferred to $C_0$ 36 and 2) the switch 40 is able to block reversed current flow, thereby retaining the energy which has been reflected to the commutation circuit 30 $C_0$ 36 until it is dissipated, the reflected energy is arrested and cannot continue to be transferred back and forth between the commutation circuit 30 and the magnetic pulse compression network 32.

One additional feature provided in the exemplary embodiment shown in FIG. 3 is the addition of a tail-biter circuit 70. The tail-biter circuit 70 preferably comprises a series diode 72 resistor 74 combination. When the reflected energy comes to rest in $C_0$ 36 as a reversed voltage 112, the tail-biter diode 72 is forward biased, enabling current 124 to flow through the tail-biter circuit 70. As a result, the charge stored in $C_0$ 36 will be dissipated in the resistance of the tail-biter circuit 70. This is indicated by the exponential decrease of the voltage 112 on $C_0$ 36. As shown, the exemplary tail-biter circuit 70 is a single diode-resistor combination however, multiple series diode-resistor combinations may be placed in parallel to increase the peak current capability of the tail-biter circuit, 70 enabling the discharge of the reflected energy stored in $C_0$ 36 over a shorter period. The period required to discharge the reflected energy from $C_0$ 36 is determined by the RC time constant formed by the $C_0$ 36 and the tail-biter resistance 74.

Also preferably included in the tail-biter circuit 70 is a means of measuring the current 76 which is conducted through the tail-biter circuit 70. The measuring means may include a current transformer, a current viewing resistor, a Hall-type current monitor or any similar device used to measure current. The amplitude of the tail-biter current 76 conducted through the tail-bitter circuit 70 may be used as a gauge to judge the performance of the system. Specifically, excessive tail-biter current 76 can indicate a severe mismatch between the output stage of the magnetic pulse compression network 32 and the load impedance 58. In addition, excessive tail-biter current 76 can be indicative of a short in the magnetic pulse compression network 32.

The present embodiment was chosen and described in order to best explain the principal of invention and its practical application to enable others skilled in the art to best utilize the invention in various embodiments and with various modifications as are suitable for the particular use contemplated. It is intended that the scope of the present invention be defined by the claims as follows.

What is claimed is:

1. A commutation circuit for arresting and dissipating energy reflected from a magnetic pulse compression network comprising:

an energy storage capacitor;
a capacitor charging circuit for charging the energy storage capacitor;
a switch for conducting current in the forward direction from the energy storage capacitor and blocking current in a reverse direction towards the energy storage capacitor;
a magnetic assist device operable to conduct current in the forward direction from the switch to a magnetic pulse compression network and to isolate a reverse voltage from the switch;
a trigger circuit for transmitting a trigger pulse signal to the switch, whereby reflected energy from the magnetic pulse compression network is transferred to the energy storage capacitor; and a tail-biter circuit connected in parallel with the energy storage capacitor and between the switch and energy storage capacitor, the tail-biter circuit being operable to discharge reflected energy stored in the energy storage capacitor.

2. The commutation circuit of claim 1, wherein the tail-biter circuit comprises at least one series diode resistor combination in parallel connection with the energy storage capacitor.

3. The commutation circuit of claim 1, further comprising a current transformer for measuring the current in the tail-biter circuit.

4. The commutation circuit of claim 1, further comprising a current viewing resistor for measuring the current in the tail-biter circuit.

5. The commutation circuit of claim 1, further comprising a Hall-type current monitor for measuring the current in the tail-biter circuit.

6. The commutation circuit of claim 1, wherein the switch comprises a thyratron.

7. The commutation circuit of claim 1, wherein the switch comprises a silicon controlled rectifier (SCR) stack assembly.

8. The commutation circuit of claim 6, wherein the trigger circuit is a thyratron grid driver for maintaining an active grid drive to the thyratron whereby reflected energy is transferred to the energy storage capacitor.

9. The commutation circuit of claim 7, wherein the trigger circuit is a SCR gate driver circuit for maintaining an active gate drive to the SCR whereby reflected energy is transferred to the energy storage capacitor.

10. The commutation circuit of claim 1, wherein the magnetic assist device further comprises:

a magnetic core;

a main set of winding wound about the magnetic core; and an auxiliary winding configured for biasing the magnetic core.

11. The commutation circuit of claim 10, wherein the magnetic core is a ferri- or ferromagnetic material.

12. The commutation circuit of claim 10, wherein the main set of windings comprises at least one winding wound about the magnetic core.

13. The commutation circuit of claim 10, wherein the magnetic core is biased in the same direction as when forward current is conducted through the main winding.

14. The commutation circuit of claim 1, further comprising a power supply for biasing the magnetic assist device.

15. The commutation circuit of claim 1, further comprising a power supply protection circuit for isolating reverse voltages from the output of the capacitor charging unit and interposed between the capacitor charging unit and the energy storage capacitor.

16. The commutation circuit of claim 15, wherein the power supply protection circuit further comprises an input resistor, a shunt inverse diode and an output resistor.

17. A method for commuting arrested energy reflected from a magnetic pulse compression network, comprising:

charging an energy storage capacitor to a predetermined voltage level;

discharging energy from the storage capacitor through a switch to the magnetic pulse compression network;

transmitting a trigger pulse to the switch whereby reflected energy is transferred to the energy storage capacitor;

isolating reverse voltages from the magnetic pulse compression network in the energy storage capacitor; and dissipating the isolated reflected energy stored in the energy storage capacitor using a tail-biter circuit located between the switch and the energy storage capacitor.

18. The method of claim 17, further comprising delaying the application of a reverse voltage from the magnetic pulse compression network to provide a delay between the end of forward conduction through the switch and application of a reverse voltage across the switch.

19. The method of claim 17, furthering comprising measuring the current being conducted.

20. The method of claim 17, further comprising the steps of gauging the performance of the commutation of the arrested energy by measuring the current conducted through the tail-biter circuit.

* * * * *